United States Patent [19]

Kudo

[11] Patent Number: 4,707,763
[45] Date of Patent: Nov. 17, 1987

[54] MOLDED ELECTRONIC CIRCUIT DEVICE

[75] Inventor: Sinji Kudo, Yokohama, Japan

[73] Assignee: Stanley Electric Co., Ltd., Tokyo, Japan

[21] Appl. No.: 684,667

[22] Filed: Dec. 21, 1984

[51] Int. Cl.$^4$ .............................................. H05K 5/06
[52] U.S. Cl. ................................. 361/386; 174/52 PE
[58] Field of Search ............... 361/386, 387, 388, 389; 357/81; 174/16 HS, 52 PE

[56] References Cited

U.S. PATENT DOCUMENTS

| | | | |
|---|---|---|---|
| 2,896,135 | 7/1959 | Briggs | 174/16 HS |
| 3,390,226 | 6/1968 | Beyerlein | 174/52 PE |
| 3,501,582 | 3/1970 | Heidler et al. | 174/52 PE |
| 4,381,518 | 4/1983 | Bahlinger | 357/81 X |
| 4,427,740 | 1/1984 | Stackhouse et al. | 310/45 X |

FOREIGN PATENT DOCUMENTS

| | | | |
|---|---|---|---|
| 2480488 | 10/1981 | France | 174/16 HS |
| 103156 | 6/1983 | Japan | 375/81 |

Primary Examiner—J. R. Scott
Assistant Examiner—Morris Ginsburg
Attorney, Agent, or Firm—Weingarten, Schurgin, Gagnebin & Hayes

[57] ABSTRACT

A molded electronic circuit device including a printed circuit board having an electronic circuit in a synthetic resin, the electronic circuit including heat-radiating electronic elements such as a power transistor and contained within a case holding the printed circuit board. According to the present invention, the synthetic resin material fills the case between the electronic elements so as to conduct heat away from the electronic elements, the synthetic resin material comprising a silicon carbide or a silicon carbide compound mixed as a major constituent in an epoxy resin and having a metal oxide added to the resultant mixture.

3 Claims, 1 Drawing Figure

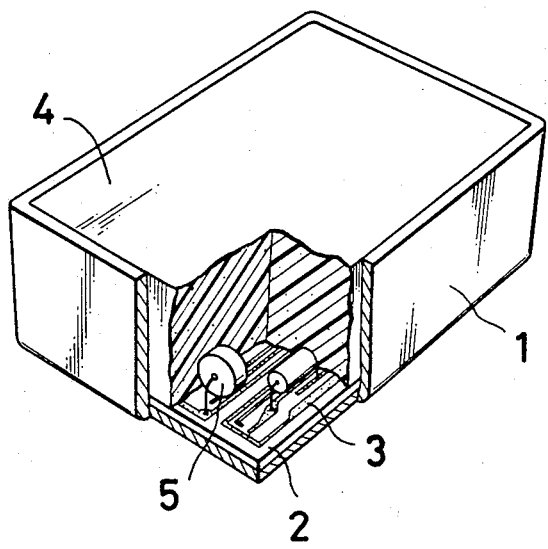

MOLDED ELECTRONIC CIRCUIT DEVICE

BACKGROUND OF THE INVENTION

1. Field of the Invention

The present invention relates to a molded electronic circuit device wherein an electronic circuit having a heat-radiating electronic element is molded in a case with a resin.

2. Description of the Prior Art

Electronic circuits incorporating small electronic elements are generally encapsulated such that a synthetic resin material is filled between electronic parts and elements so as to improve reliability and resistance to vibration, humidity and dust. The electronic circuits and elements are molded in a case as a single unit. A synthetic resin material for molding comprises a thermosetting resin such as epoxy resin, polyimide resin, polyester resin or polyamide-imide resin. However, thermosetting resins are easily influenced by temperature changes. The performance or function of the electronic elements molded by a thermosetting resin and hence their reliability is degraded by humidity.

Silica (silicon oxide), which has a high resistance to humidity, can be used as the resin material. However, silica has a low thermal conductivity and therefore cannot be used as a material for molding an electronic circuit having heat-radiating electronic elements. Some materials which have good thermal conductivity are aluminum oxide, magnesium oxide, beryllium oxide or the like. However, such a material has hygroscopicity. The oxide is not completely hardened, or insulation between the electronic elements and circuits is degraded. In addition to these disadvantages, moisture is absorbed in the resin, and this causes degradation in the performance or function of electronic elements. The oxide cannot be used as a molding material without modification.

SUMMARY OF THE INVENTION

It is an object of the present invention to provide a molded electronic circuit device comprising: a printed circuit board having an electronic circuit, the electronic circuit being partially constituted by heat-radiating electronic elements such as a power transistor; a case for holding the printed circuit board; and a molding synthetic resin material filled in the case between the electronic elements so as to radiate heat from the electronic elements, the molding synthetic resin material being obtained such that silicon carbide or a silicon carbide compound is mixed as a major constituent in an epoxy resin and that a metal oxide such as aluminum oxide, magnesium oxide or beryllium oxide is added to a resultant mixture. The resultant resin material has good resistance to humidity, electrical insulation properties and thermal conductivity, thereby providing a reliable molded electronic circuit device.

BRIEF DESCRIPTION OF THE DRAWING

The accompanying drawing is a partial cutaway perspective view of a molded electronic circuit device according to the present invention.

DESCRIPTION OF THE PREFERRED EMBODIMENT

The present invention relates to a molded electronic circuit device. The device comprises a case 1, an electronic circuit 3 mounted on a printed circuit board 2, and a molding synthetic resin material 4. The case 1 comprises a resin or metal housing having an open upper end. The electronic circuit 3 housed in the case 1 is mounted on the printed circuit board 2 and is constituted by a number of electronic elements 5, such as a power transistor. The hybrid printed circuit board 2 is mounted in a predetermined position of the case 1, and the molding synthetic resin material 4 is injected therein. The resin material 4 is cured to seal and fix the electronic elements 5 together with the printed circuit board 2 in the case 1.

The molding synthetic resin material is obtained such that silicon carbide is mixed as a major constituent in epoxy resin, and that an oxide such as aluminum oxide, magnesium oxide or beryllium oxide is added to the resultant mixture. This molding synthetic resin material has good electrical insulation properties and resistance to humidity. Resistance to humidity and good electrical insulation properties are inherent to silicon carbide, and good thermal conductivity is inherent to the oxide mixed in the molding synthetic resin material. Since the resin material is also chemically stable, the metal oxides and the compounds comprising silicon carbide and epoxy are not chemically changed.

Silicon carbide and an oxide serve to increase a thermal conductivity and have a small contraction factor when they are hardened. The high thermal conductivity increases heat-radiation from the electronic elements when the electronic circuit 3 is molded in the case 1. The small contraction factor plays an important role in allowing the electronic elements to be easily molded. When the contraction factor is large, a stress acts on the electronic elements 5 when the synthetic resin is cured, resulting in circuit disconnections and changes in electrical characteristics of the elements.

Silicon carbide as a powder having a particle size of about 6 to $10\mu$ is used. However, silicon carbide powder cannot be easily dispersed in the epoxy resin. In order to improve dispersion, silicon carbide is chemically combined with the epoxy resin to produce a silicon carbide compound. This silicon carbide compound is dispersed in the epoxy resin. Alternatively, the surface of the silicon carbide powder is treated with a silane coupling agent, and the resultant silicon carbide is dispersed in the epoxy resin. The particle size of the silicon carbide powder preferably falls within the range of about 6 to $10\mu$. When the particle size is smaller than $6\mu$, electrical insulation is improved but the thermal conductivity is decreased, thereby degrading the heat radiation effect. When the particle size is harger than $10\mu$ the thermal conductivity is increased which improves heat radiation, but the electrical insulation is degraded. In order to have both good electrical insulation properties and good heat radiation, the particle size must fall within the range of 6 to $10\mu$, as described above.

Silicon carbide and/or a compound thereof and the metal oxide are mixed in the synthetic resin for molding the electronic circuit and elements so as to improve resistance to humidity, electrical insulation properties, thermal conductivity. Thus, a highly reliable electronic circuit device can be provided wherein heat from heat-radiating electronic elements such as a power transistor can be effectively radiated to prevent damage to the electronic elements, and wherein performance and function of the electronic elements are not degraded by humidity.

What is claimed is:

1. A molded electronic circuit device comprising:
a printed circuit board having an electronic circuit, the electronic circuit being partially constituted by heat-radiating electronic elements such as a power transistor; a case for holding the printed circuit board; and a molding synthetic resin material filled in the case between the electronic elements so as to conduct heat away from the electronic elements, the molding synthetic resin material being obtained such that one of silicon carbide and a silicon carbide compound is mixed as a major constituent in an epoxy resin and that a metal oxide is added to a resultant mixture, wherein the silicon carbide and the silicon carbide compound comprise a powder whose particle size falls within the range of 6 to $10\mu$.

2. A device according to claim 1, wherein the silicon carbide compound is obtained by the mixture of silicon carbide with an epoxy resin.

3. A device according to claim 1, wherein the metal oxide is a material selected from the group consisting of aluminum oxide, magnesium oxide and beryllium oxide.

* * * * *